US011206011B2

(12) United States Patent
Nakazawa et al.

(10) Patent No.: US 11,206,011 B2
(45) Date of Patent: Dec. 21, 2021

(54) FILTER AND MULTIPLEXER

(71) Applicant: Murata Manufacturing Co., Ltd., Nagaokakyo (JP)

(72) Inventors: Hidetaro Nakazawa, Nagaokakyo (JP); Tetsuro Okuda, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/536,625

(22) Filed: Aug. 9, 2019

(65) Prior Publication Data

US 2020/0083866 A1 Mar. 12, 2020

(30) Foreign Application Priority Data

Sep. 6, 2018 (JP) .............................. JP2018-166724

(51) Int. Cl.
*H03H 9/72* (2006.01)
*H03H 9/54* (2006.01)
*H03H 9/64* (2006.01)

(52) U.S. Cl.
CPC ................ *H03H 9/72* (2013.01); *H03H 9/54* (2013.01); *H03H 9/64* (2013.01)

(58) Field of Classification Search
CPC ............... H03H 9/72; H03H 9/54; H03H 9/64
USPC ....................................................... 333/133
See application file for complete search history.

(56) References Cited

U.S. PATENT DOCUMENTS

| 2005/0174014 | A1* | 8/2005 | Korden | H03H 9/25 310/322 |
| 2007/0279157 | A1* | 12/2007 | Bauer | H03H 9/0057 333/195 |
| 2013/0342285 | A1* | 12/2013 | Kadota | H03H 9/542 333/188 |
| 2018/0041194 | A1* | 2/2018 | Ito | H03H 9/706 |
| 2018/0097507 | A1* | 4/2018 | Scott | H03H 9/6403 |
| 2018/0115300 | A1* | 4/2018 | Kaneko | H03H 9/6483 |
| 2019/0123722 | A1 | 4/2019 | Nosaka | |

FOREIGN PATENT DOCUMENTS

| WO | 2014/167755 A1 | 10/2014 |
| WO | 2017/217197 A1 | 12/2017 |

* cited by examiner

*Primary Examiner* — Robert J Pascal
*Assistant Examiner* — Hafizur Rahman
(74) *Attorney, Agent, or Firm* — Keating & Bennett, LLP

(57) ABSTRACT

A filter includes a signal path connecting an input terminal and an output terminal one or more series arm circuits on the signal path, and one or more parallel arm circuits connected to one or more nodes disposed on the signal path and a ground electrode. The one or more series arm circuits define any of a section between nodes adjacent to each other, a section between a node closest to the input terminal and the input terminal, and a section between a node closest to the output terminal and the output terminal. Among the one or more series arm circuits and the one or more parallel arm circuits, one circuit does not include any acoustic wave resonator, and another circuit includes an acoustic wave resonator.

14 Claims, 17 Drawing Sheets

FILTER AND MULTIPLEXER

CROSS REFERENCE TO RELATED APPLICATIONS

This application claims the benefit of priority to Japanese Patent Application No. 2018-166724 filed on Sep. 6, 2018. The entire contents of this application are hereby incorporated herein by reference.

BACKGROUND OF THE INVENTION

1. Field of the Invention

The present invention relates to a filter and a multiplexer.

2. Description of the Related Art

With respect to recent mobile phones, there has been a demand for a single terminal that supports multiple frequency bands and multiple wireless modes, which are termed multiband compatibility and multimode compatibility. To respond to this demand, a multiplexer that separates and combines high-frequency signals having multiple wireless carrier frequencies is disposed next to one antenna. As a plurality of band pass filters defining a multiplexer, acoustic wave filters are used that exhibit low losses in respective pass bands and the steepness of pass band characteristics around the respective pass bands (for example, International Publication No. 2017/217197).

A multiplexer disclosed in International Publication No. 2017/217197 includes a first filter disposed between a common terminal and a first input-output terminal, a second filter disposed between the common terminal and a second input-output terminal, and a capacitor disposed in series with a connection path between the common terminal and the first filter. The first filter is defined by one or more surface acoustic wave resonators. A Q value of the capacitor in a pass band of the second filter (hereinafter referred to as a second pass band) is higher than a Q value in the second pass band in the case where the one or more surface acoustic wave resonators defining the first filter are regarded as capacitance.

In this configuration, the Q value of the first filter equivalently defining and functioning as a capacitor that has a low Q value in the second pass band is able to be increased by the capacitor disposed in series with the connection path between the common terminal and the first filter. As a result, the reflection coefficient of the first filter in the second pass band is increased, and the insertion loss of the second filter connected to the common terminal together with the first filter in the second pass band is reduced.

Recently, new frequency bands have been opened up, and a carrier aggregation technique has become widespread in which communication is performed by using multiple frequency bands simultaneously. Against this backdrop, there has been an increasing number of circumstances in which nonlinear distortion of a filter of a multiplexer occurs in a frequency band in use. For example, when nonlinear distortion occurs in a reception band in use, a drawback, such as deterioration in reception sensitivity, arises.

SUMMARY OF THE INVENTION

Preferred embodiments of the present invention provide filters that each have small nonlinear distortion and multiplexers including such filters.

A filter according to a preferred embodiment of the present invention includes an input terminal; an output terminal; a signal path connecting the input terminal and the output terminal and being defined by one or more series arm circuits; and one or more parallel arm circuits connected to one or more nodes disposed on the signal path and a ground electrode. The one or more series arm circuits define any of a section between nodes adjacent to each other, a section between a node closest to the input terminal and the input terminal, and a section between a node closest to the output terminal and the output terminal. Among the one or more series arm circuits and the one or more parallel arm circuits, one circuit does not include any acoustic wave resonator, and another circuit includes an acoustic wave resonator.

In this configuration, a configuration in which the one or more series arm circuits and the one or more parallel arm circuits include an acoustic wave resonator is equivalent to a basic configuration of a ladder acoustic wave filter. On the other hand, in the above-described configuration, one series arm circuit or one parallel arm circuit does not include any acoustic wave resonator, and thus, the filter is obtained in which nonlinear distortion caused by an acoustic wave resonator is reduced in comparison with a basic ladder acoustic wave filter.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described in detail below with reference to the drawings. Note that all of the preferred embodiments described below describe general or specific examples. Numerical values, shapes, materials, components, the arrangement and connection configuration of the components, and so forth that are described in the following preferred embodiments are merely examples and are not intended to limit the present invention.

First Preferred Embodiment

A filter according to a first preferred embodiment of the present invention will be described by taking a ladder acoustic wave filter as an example. A ladder acoustic wave filter herein refers to a filter including a signal path connecting an input terminal and an output terminal and being defined by one or more series arm circuits, and one or more parallel arm circuits connected to one or more nodes disposed on the signal path and a ground electrode. The one or more series arm circuits define any of a section between nodes adjacent to each other, a section between a node closest to the input terminal and the input terminal, and a section between a node closest to the output terminal and the output terminal. At least one series arm circuit and at least one parallel arm circuit include an acoustic wave resonator.

First, a configuration of a basic ladder acoustic wave filter will be described.

Figure 1:
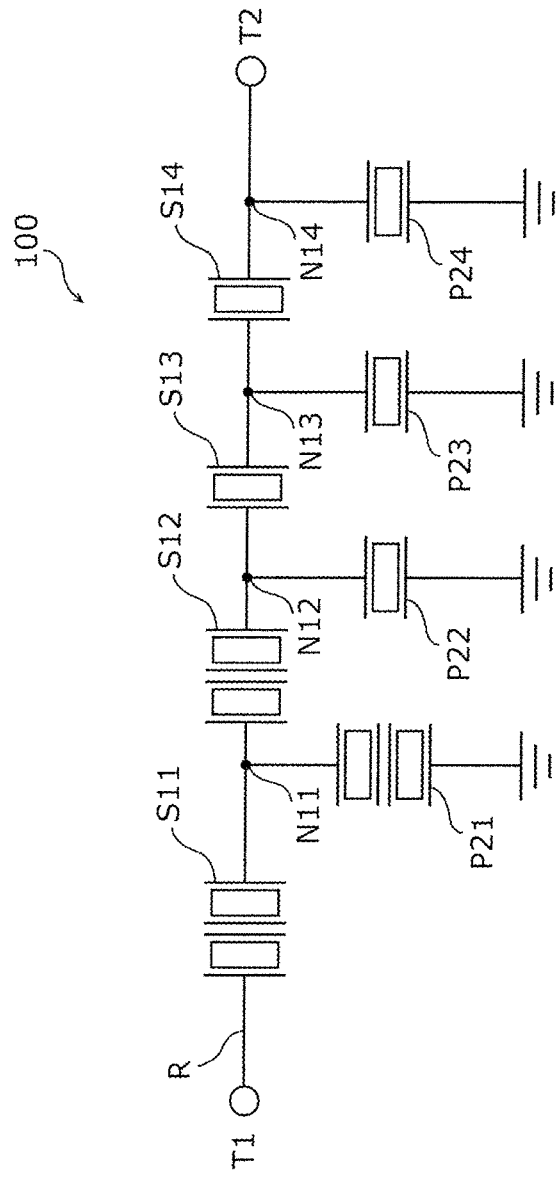
FIG. 1 is a circuit diagram illustrating an example of a configuration of a basic filter.

FIG. 1 is a circuit diagram illustrating an example of a configuration of a basic ladder acoustic wave filter. As illustrated in FIG. 1, a filter 100 includes terminals T1 and T2, a signal path R that connects the terminals T1 and T2 and on which nodes N11 to N14 are disposed, series arm circuits S11 to S14, and parallel arm circuits P21 to P24.

The series arm circuits S11 to S14 respectively define a section between the terminal T1 of the signal path R and the node N11, a section between the nodes N11 and N12, a section between the nodes N12 and N13, and a section between the nodes N13 and N14. The parallel arm circuits P21 to P24 are connected between the nodes N11 to N14 and respective ground terminals.

Here, one of the terminals T1 and T2 is an input terminal to receive a first high-frequency signal, and the other one of the terminals T1 and T2 is an output terminal to output a second high-frequency signal obtained by performing a filtering process on the first high-frequency signal. The input terminal and the output terminal are not limited to the terminal T1 or T2, and the filter 100 may perform a filtering process on high-frequency signals in both directions. That is, the terminals T1 and T2 may be freely associated with the input terminal and the output terminal and such associations may be changed at any time.

Each of the series arm circuits S11 to S14 and the parallel arm circuits P21 to P24 is defined by an acoustic wave resonator. Each of the series arm circuits S11 to S14 and the parallel arm circuits P21 to P24 may include a circuit element, for example, an inductor or the like, other than the acoustic wave resonator.

Acoustic wave resonators that define the series arm circuits S11 to S14 and the parallel arm circuits P21 to P24 may be, for example, surface acoustic wave resonators including a substrate having piezoelectricity and an interdigital transducer (IDT) electrode provided on the substrate.

Each of the series arm circuits S11 and S12 and the parallel arm circuit P21 includes two division resonators connected in series. When a division resonator is used, for example, characteristics equivalent to characteristics of a single acoustic wave resonator are able to be achieved with a larger element size, thus improving the electric power handling capability.

In the filter 100 configured in this way, due to the nonlinearity of the acoustic wave resonators that define the series arm circuits S11 to S14 and the parallel arm circuits P21 to P24, nonlinear distortion, such as harmonic distortion of an input signal or intermodulation distortion between two input signals, occurs.

New frequency bands have been opened up, and a carrier aggregation technique has become widespread in which communication is performed by using multiple frequency bands simultaneously. Accordingly, there has been an increasing number of circumstances in which nonlinear distortion of a filter occurs in a frequency band in use. For example, when nonlinear distortion occurs in a reception band in use, problems, such as deterioration in reception sensitivity, arise.

Thus, the inventors of preferred embodiments of the present invention developed a ladder filter in which, among one or more series arm circuits and one or more parallel arm circuits, one circuit does not include any acoustic wave resonator and another circuit includes an acoustic wave resonator.

Figure 2:
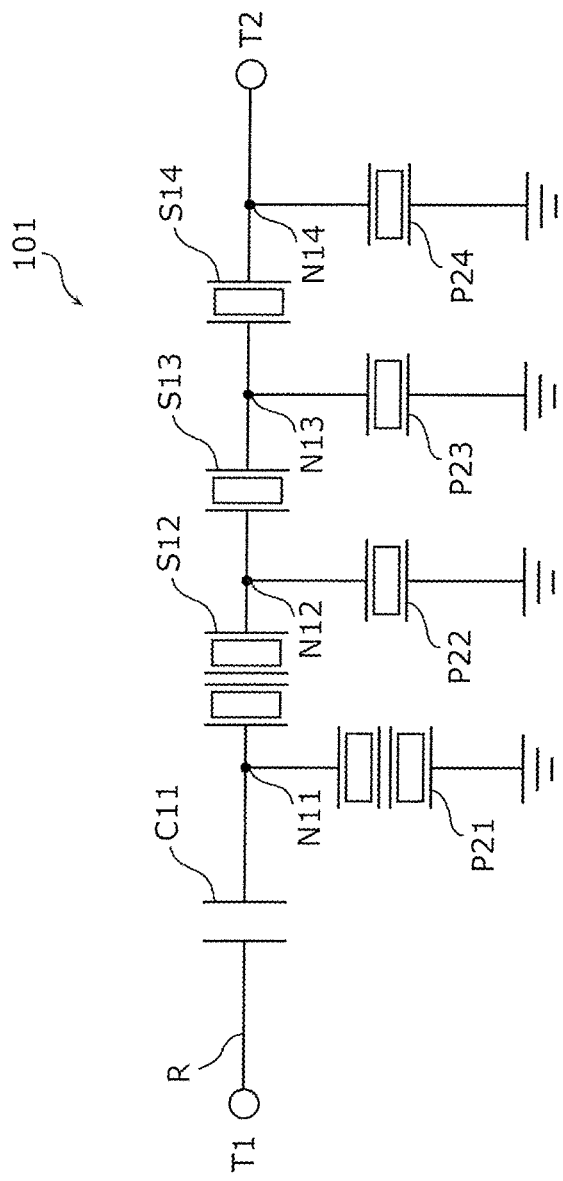
FIG. 2 is a circuit diagram illustrating an example of a configuration of a filter according to a first preferred embodiment of the present invention.

FIG. 2 is a circuit diagram illustrating an example of a configuration of a filter according to a first preferred embodiment of the present invention. As illustrated in FIG. 2, in a filter 101, the series arm circuit S11 of the filter 100 in FIG. 1, which is the basic ladder acoustic wave filter, is replaced with a series arm circuit C11 that is defined by a capacitance element and does not include any acoustic wave resonator.

The series arm circuit C11 defines a section between the terminal T1 and the node N11. The series arm circuit S12 defines a section between the node N11 and the node N12. The series arm circuit S13 defines a section between the node N12 and the node N13. The series arm circuit S14 defines a section between the node N13 and the terminal T2.

The parallel arm circuit P21 is connected between the node N11 and a ground electrode. The parallel arm circuit P22 is connected between the node N12 and the ground electrode. The parallel arm circuit P23 is connected between the node N13 and the ground electrode. The parallel arm circuit P24 is connected between the node N14 and the ground electrode.

Each of the series arm circuits S12 to S14 and the parallel arm circuits P21 to P24 includes an acoustic wave resonator, and the series arm circuit C11 is defined by the capacitance element and does not include any acoustic wave resonator.

The capacitance element defining the series arm circuit C11 may be defined by an IDT electrode provided on the same piezoelectric substrate on which the acoustic wave resonators of the series arm circuits S12 to S14 and the parallel arm circuits P21 to P24 are provided, or may be defined by a surface mount device mounted on the substrate.

In the filter 101, the series arm circuit C11 does not include any acoustic wave resonator, and thus, nonlinear distortion caused by an acoustic wave resonator is reduced in comparison with the basic ladder acoustic wave filter shown in FIG. 1. Specifically, the series arm circuit C11 is defined by the capacitance element with smaller nonlinearity than an acoustic wave resonator, and thus, the filter is obtained that has small nonlinear distortion while having characteristics close to characteristics of the basic ladder acoustic wave filter.

Figure 3:
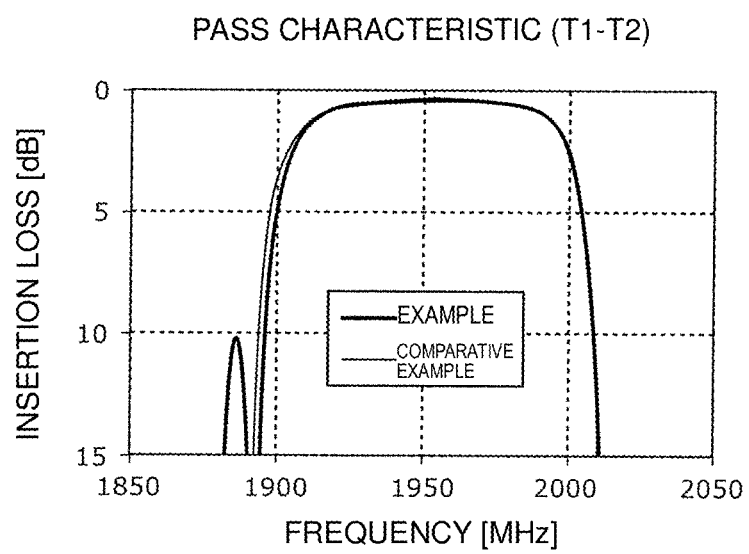
FIG. 3 is a graph illustrating an example of a pass band characteristic of the filter according to the first preferred embodiment of the present invention.

FIG. 3 is a graph illustrating an example of a pass band characteristic of the filter according to the first preferred embodiment. In FIG. 3, the filters 100 and 101 in which individual acoustic wave resonators are designed so that a pass band from about 1920 MHz to about 1980 MHz is obtained are respectively regarded as a comparative example and an example, and insertion losses between the terminals T1 and T2 are indicated. The insertion losses illustrated in FIG. 3 do not include any loss due to mismatching.

As seen in FIG. 3, the comparative example and the example are the same or substantially the same in pass band characteristic. The pass band characteristic of the filter 100 (comparative example) is defined by eight acoustic wave resonators, whereas the pass band characteristic of the filter 101 (example) is defined by seven acoustic wave resonators. Thus, there is no significant difference between the filters 100 and 101 in the number of acoustic wave resonators that define a pass band characteristic, and it is therefore considered that, even in the filter 101, a favorable pass band characteristic close to the pass band characteristic of the filter 100 is able to be provided.

Thus, when, among the eight acoustic wave resonators of the filter 100, an acoustic wave resonator most strongly involved in the occurrence of nonlinear distortion is replaced with a capacitance element, that is, when, among the series arm circuits S11 to S14 and the parallel arm circuits P21 to P24, one circuit is defined by a capacitance element and does not include any acoustic wave resonator, a filter is able to be obtained that has small nonlinear distortion while having characteristics close to characteristics of the filter 100.

In an example studied by the inventors of preferred embodiments of the present invention, assuming that the terminals T1 and T2 of the filter 100 are respectively an input terminal and an output terminal, the series arm circuit S14 closest to the terminal T2 (output terminal) is preferably defined by a capacitance element and does not include any acoustic wave resonator, thus most effectively reducing harmonic distortion. Furthermore, the series arm circuit S11 closest to the terminal T1 (input terminal) is preferably defined by a capacitance element and does not include any acoustic wave resonator, thus most effectively reducing intermodulation distortion.

Figure 4:
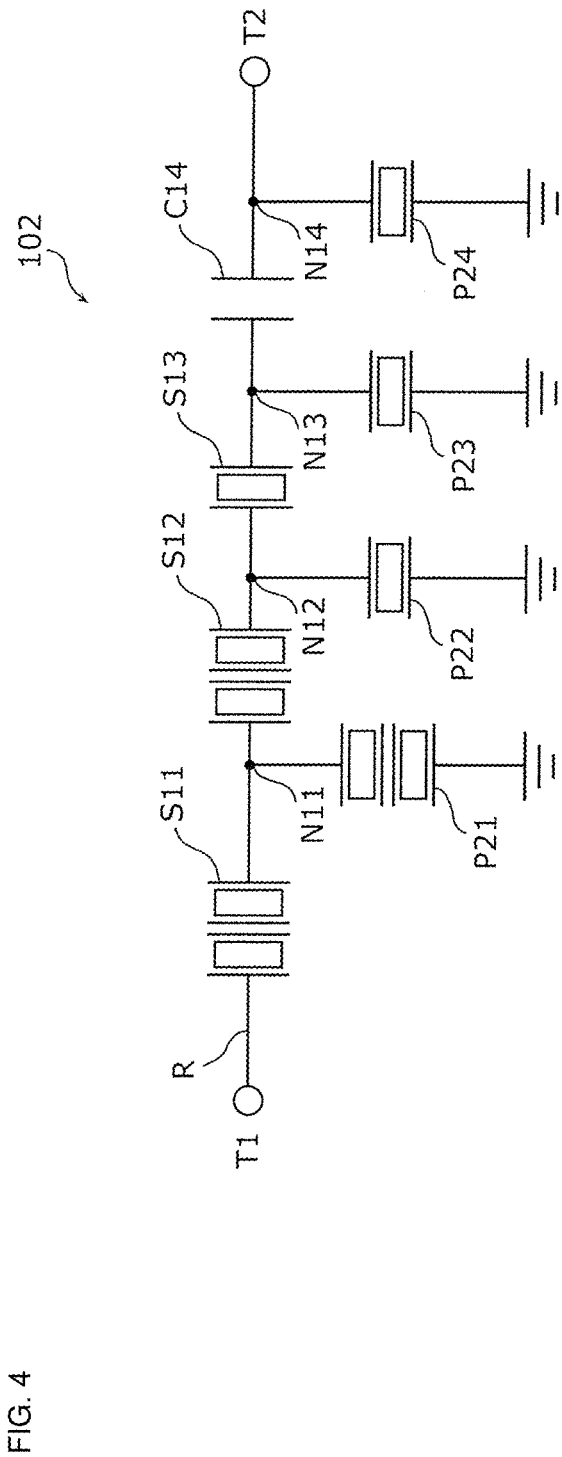
FIG. 4 is a circuit diagram illustrating an example of a configuration of a filter according to the first preferred embodiment of the present invention.

FIG. 4 is a circuit diagram illustrating an example of a configuration of a filter according to the first preferred embodiment. As illustrated in FIG. 4, in a filter 102, the series arm circuit S14 of the filter 100 is replaced with a series arm circuit C14 that is defined by a capacitance element and does not include any acoustic wave resonator.

Figure 5:
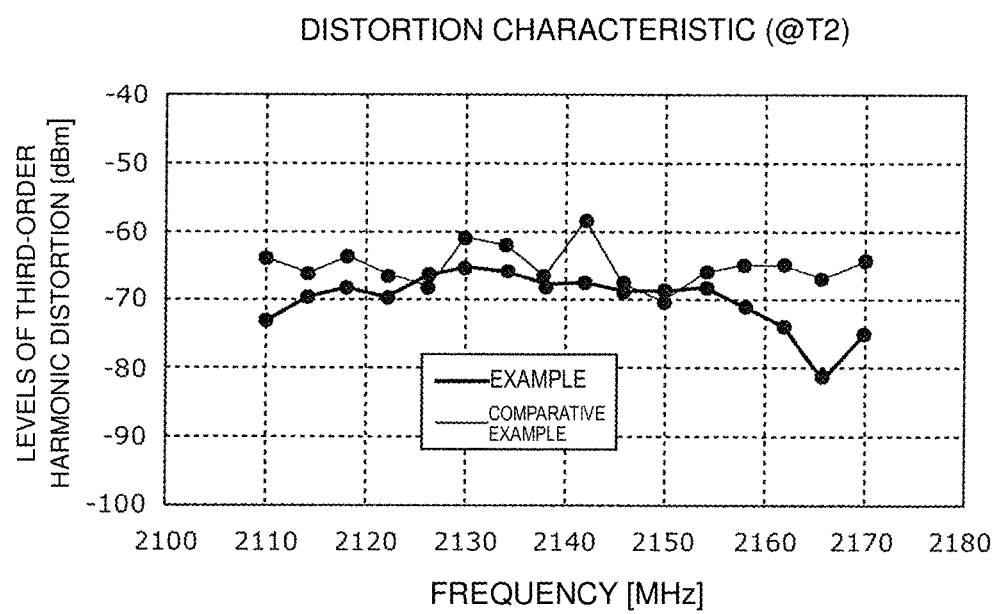
FIG. 5 is a graph illustrating an example of a distortion characteristic of the filter according to the first preferred embodiment of the present invention.
Figure 6:
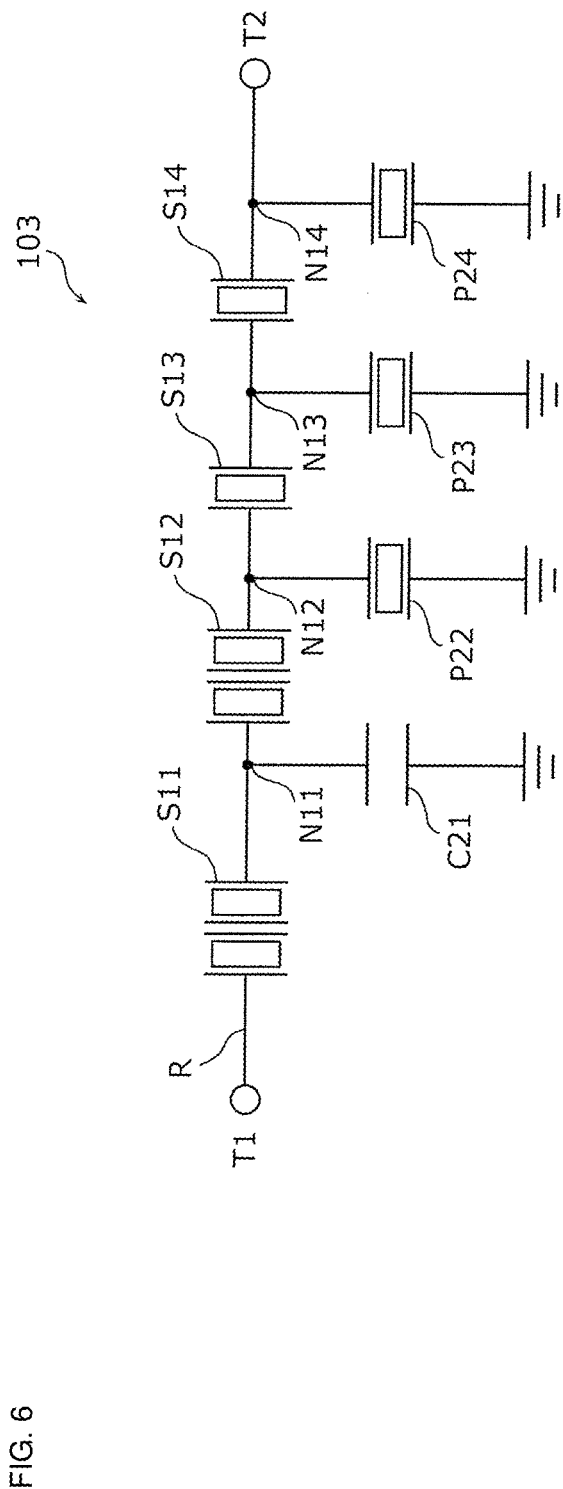
FIG. 6 is a circuit diagram illustrating an example of a configuration of a filter according to the first preferred embodiment of the present invention.
Figure 7:
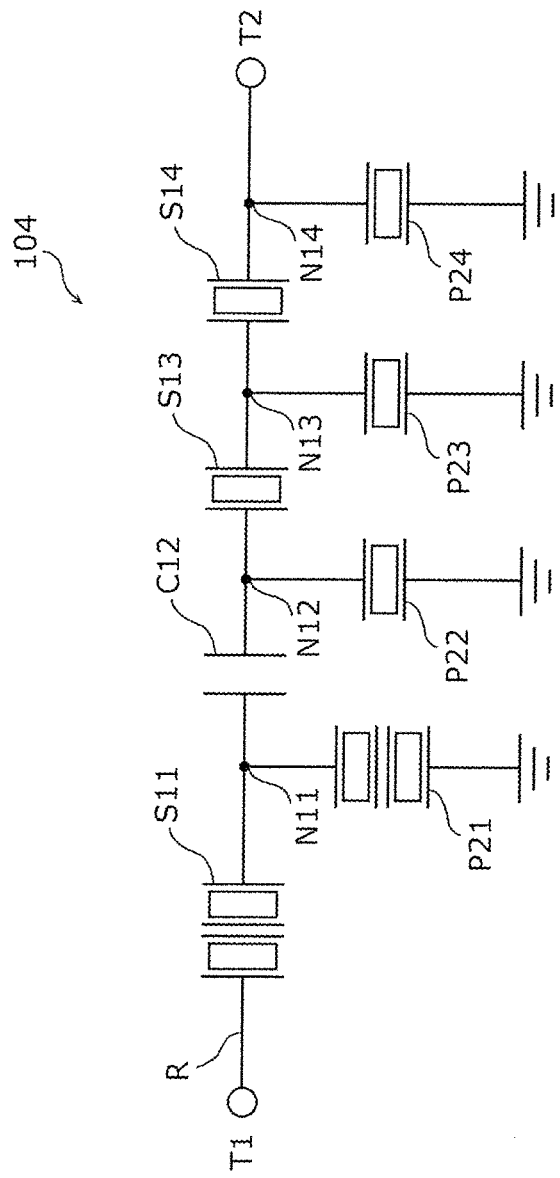
FIG. 7 is a circuit diagram illustrating an example of a configuration of a filter according to the first preferred embodiment of the present invention.
Figure 8:
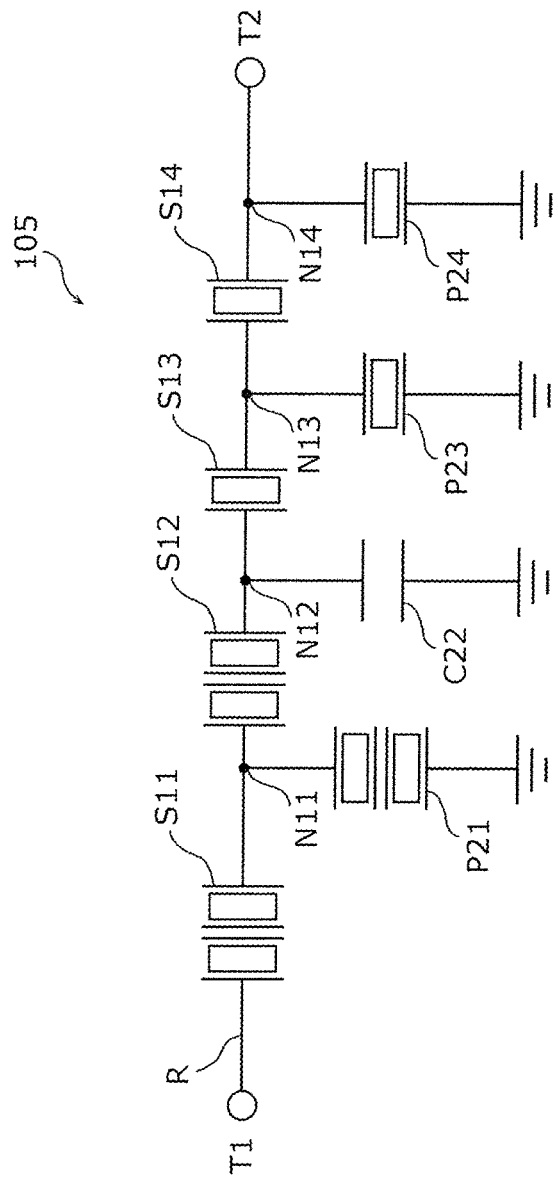
FIG. 8 is a circuit diagram illustrating an example of a configuration of a filter according to the first preferred embodiment of the present invention.
Figure 9:
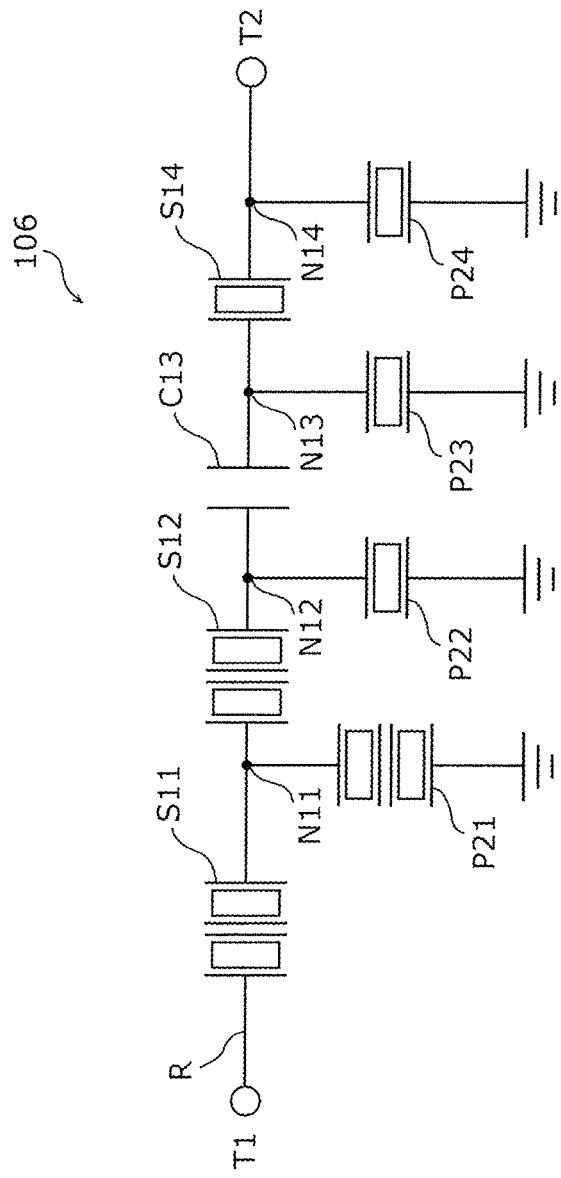
FIG. 9 is a circuit diagram illustrating an example of a configuration of a filter according to the first preferred embodiment of the present invention.
Figure 10:
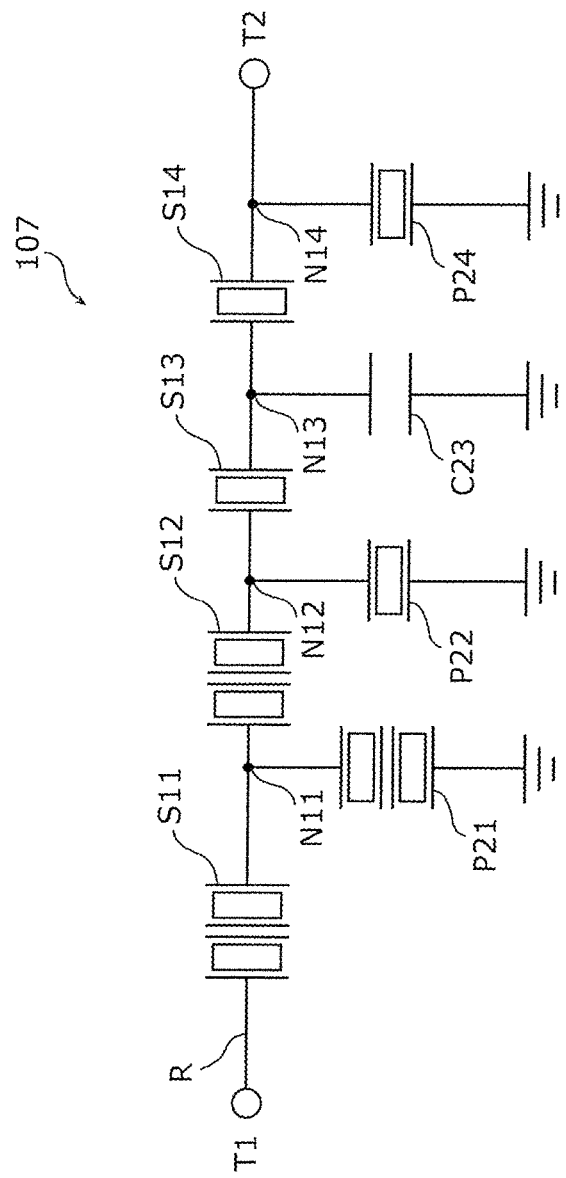
FIG. 10 is a circuit diagram illustrating an example of a configuration of a filter according to the first preferred embodiment of the present invention.
Figure 11:
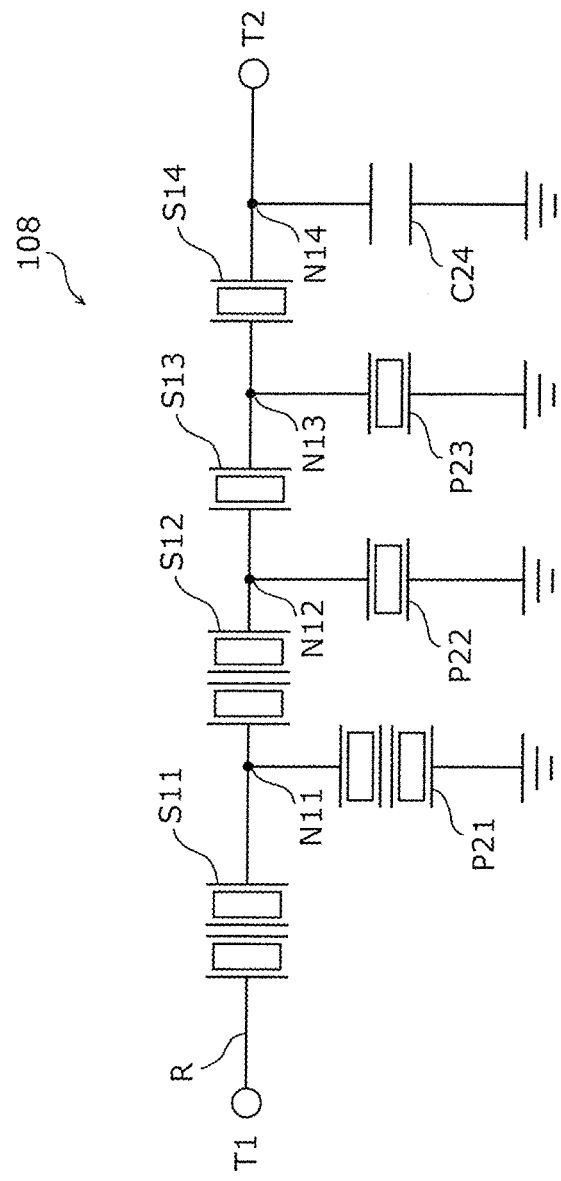
FIG. 11 is a circuit diagram illustrating an example of a configuration of a filter according to the first preferred embodiment of the present invention.

FIG. 5 is a graph illustrating an example of a distortion characteristic of the filter according to the first preferred embodiment. In FIG. 5, the filter 100 and the filter 102 are respectively regarded as a comparative example and an example, and the levels of third-order harmonic distortion output to the respective terminals T2 when the same test signal is applied to the respective terminals T1 are indicated for a frequency band from about 2110 MHz to about 2170 MHz.

As seen in FIG. 5, third-order harmonic distortion output to the terminal T2 of the filter 102 (example) is reduced over substantially the entire frequency band in comparison with the filter 100 (comparative example). From the result, it was discovered that, when, among a plurality of series arm circuits of a ladder filter, for example, a series arm circuit closest to an output terminal is defined by a capacitance element and does not include any acoustic wave resonator, third-order harmonic distortion is effectively reduced.

Among the series arm circuits S11 to S14 and the parallel arm circuits P21 to P24 of the filter 100, a circuit that is to be replaced with a circuit that does not include any acoustic wave resonator for the sake of reducing nonlinear distortion is not limited to the series arm circuit S11 or S14. From among the series arm circuits S11 to S14 and the parallel arm circuits P21 to P24, a circuit in which nonlinear distortion is most effectively reduced when the circuit is replaced with a circuit that is defined by a capacitance element and does not include any acoustic wave resonator is identified, for example, by simulation or the like, and the identified circuit may preferably be replaced with the circuit that is defined by the capacitance element and does not include any acoustic wave resonator.

FIGS. 6 to 11 are circuit diagrams illustrating an example of a configuration of a filter according to the first preferred embodiment. As illustrated in FIGS. 6 to 11, in filters 103 to 108, any one circuit of the parallel arm circuit P21, the series arm circuit S12, the parallel arm circuit P22, the series arm circuit S13, and the parallel arm circuits P23 and P24 that are included in the filter 100 is replaced with one corresponding circuit of a parallel arm circuit C21, a series arm circuit C12, a parallel arm circuit C22, a series arm circuit C13, and parallel arm circuits C23 and C24 that are defined by a capacitance element and do not include any acoustic wave resonator.

Thus, preferred embodiments of the present invention include a filter including a signal path connecting an input terminal and an output terminal and being defined by one or more series arm circuits, and one or more parallel arm circuits connected to one or more nodes disposed on the signal path and a ground electrode. The one or more series arm circuits define any of a section between nodes adjacent to each other, a section between a node closest to the input terminal and the input terminal, and a section between a node closest to the output terminal and the output terminal. At least one series arm circuit and/or at least one parallel arm circuit do not include any acoustic wave resonator, and another circuit includes an acoustic wave resonator.

An acoustic wave resonator included in a series arm circuit is not limited to the above-described acoustic wave resonator or division resonator and may be, for example, a longitudinally coupled resonator.

Figure 12:
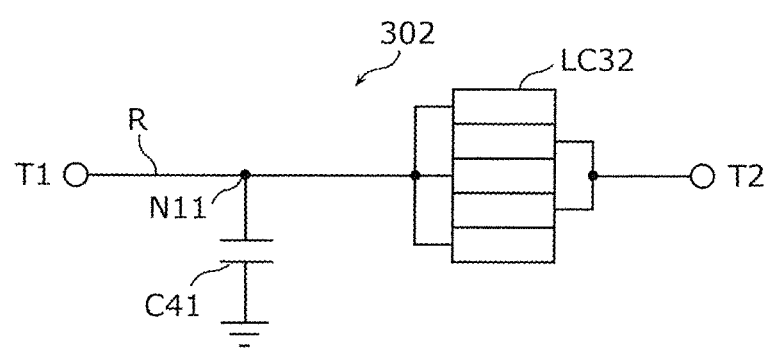
FIG. 12 is a circuit diagram illustrating an example of a configuration of a filter according to a modification of the first preferred embodiment of the present invention.

FIG. 12 is a circuit diagram illustrating an example of a configuration of a filter according to a modification of the first preferred embodiment. In FIG. 12, a minimally configured ladder filter that includes one series arm circuit and one parallel arm circuit is illustrated. As illustrated in FIG. 12, a filter 302 includes the terminals T1 and T2, the signal path R that connects the terminals T1 and T2 and on which the node N11 is disposed, a series arm circuit LC32, and a parallel arm circuit C41.

The series arm circuit LC32 defines a section between the node N11 of the signal path R and the terminal T2. The parallel arm circuit C41 is connected between the node N11 and a ground terminal. The series arm circuit LC32 includes a longitudinally coupled resonator. The parallel arm circuit C41 is defined by a capacitance element and does not include any acoustic wave resonator.

The configuration of the filter 302 corresponds to a configuration in which, in an acoustic wave filter where a longitudinally coupled resonator is disposed on the signal path R and an acoustic wave resonator is connected between the signal path R and the ground electrode, the acoustic wave resonator is replaced with a capacitance element.

Thus, the filter 302 has small nonlinear distortion while having characteristics close to characteristics of the acoustic wave filter including the longitudinally coupled resonator prior to the replacement of the acoustic wave resonator with a capacitance element.

Second Preferred Embodiment

A multiplexer according to a second preferred embodiment of the present invention will be described by taking, as an example, a multiplexer including a plurality of filters each including one end connected to one another. As at least one filter of the plurality of filters, the filter described in the first preferred embodiment is preferably provided.

Figure 13:
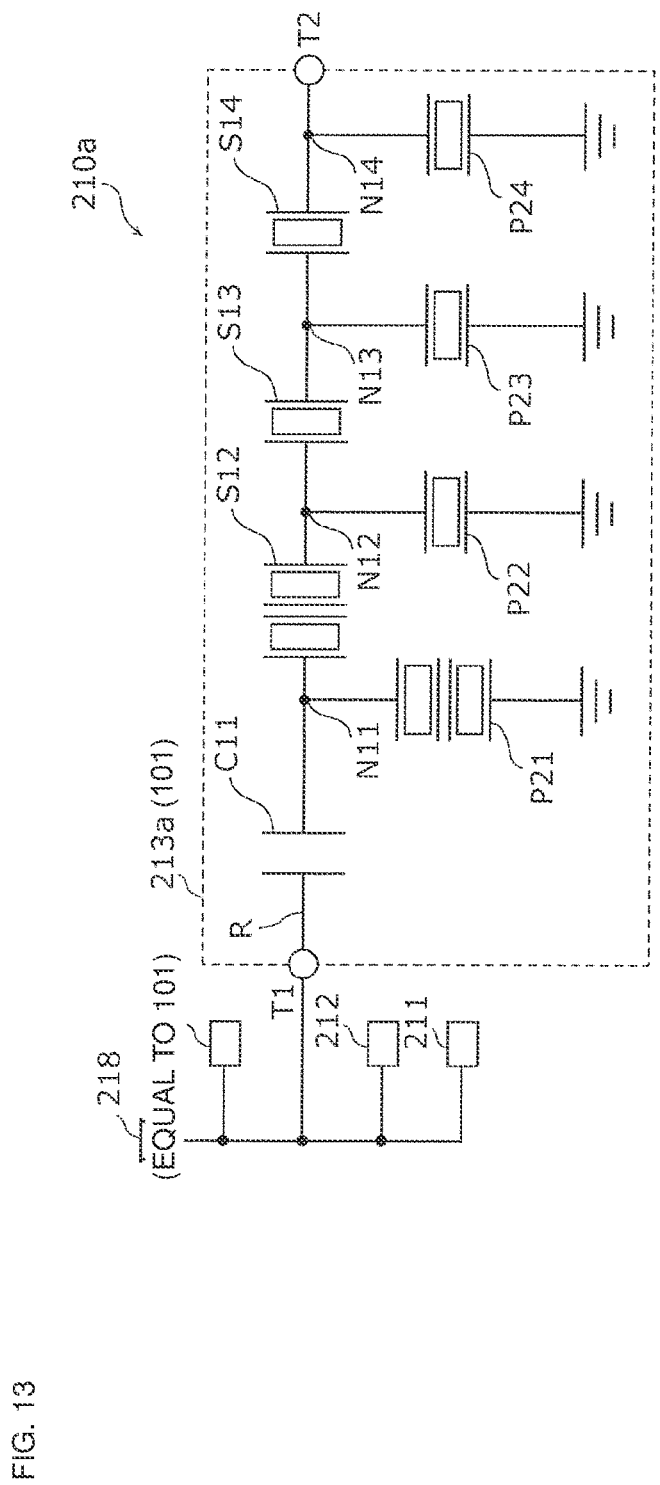
FIG. 13 is a circuit diagram illustrating an example of a configuration of a multiplexer according to a second preferred embodiment of the present invention.

FIG. 13 is a circuit diagram illustrating an example of a configuration of the multiplexer according to the second preferred embodiment. As illustrated in FIG. 13, a multiplexer 210a includes filters 211, 212, 213a, and 214 each including one end connected to one another and are connected to an antenna 218. As the filter 213a, the filter 101 in FIG. 2 is provided.

In the multiplexer 210a configured in this way, the filter 101 with small nonlinear distortion is used as the filter 213a, and thus, the multiplexer is obtained that has little deterioration in characteristics caused by nonlinear distortion that occurs in the filter 213a.

The effect of improving a distortion characteristic achieved by the multiplexer 210a will be described assuming practical use in a front-end circuit.

Figure 14:
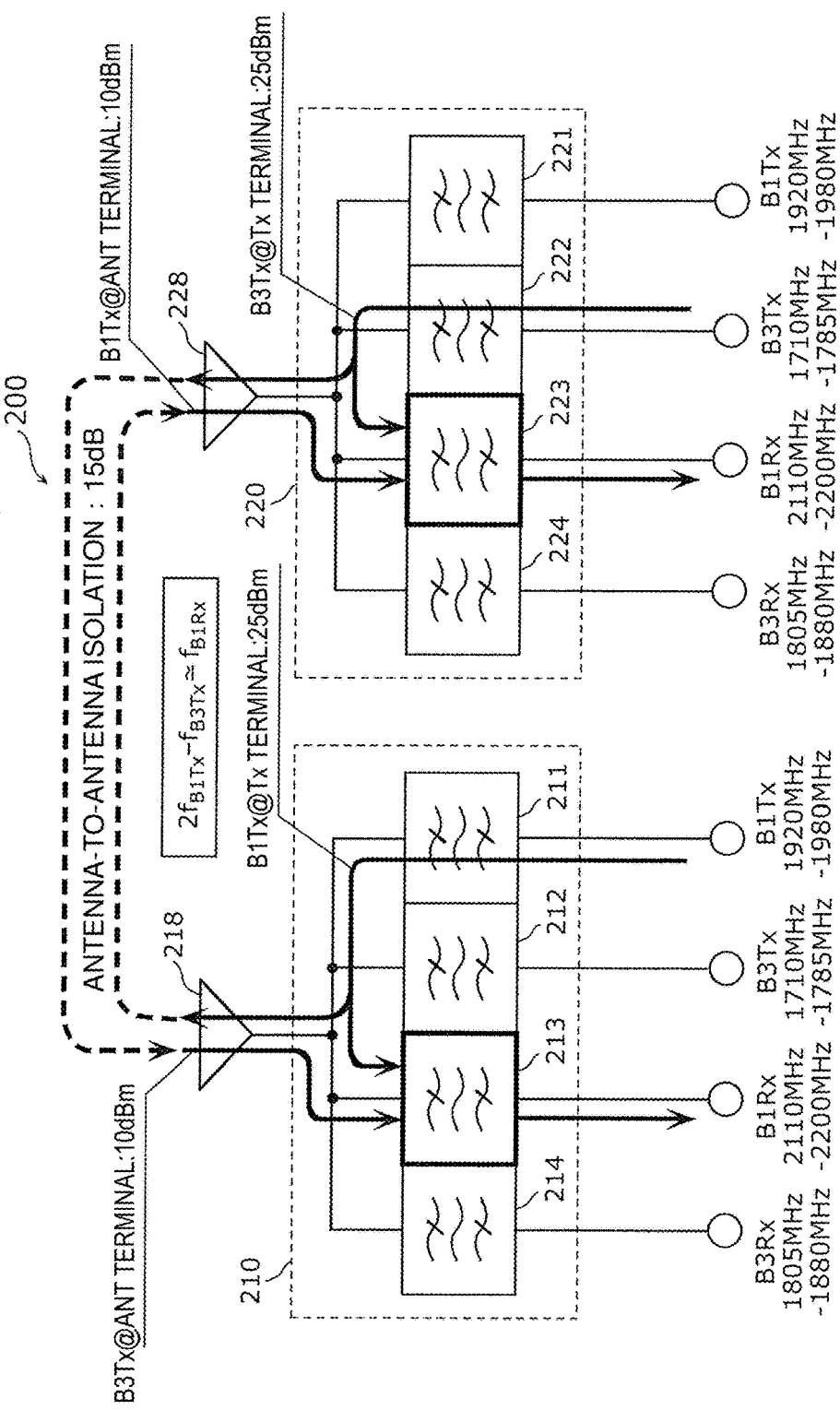
FIG. 14 is a block diagram illustrating an example of using a multiplexer according to the second preferred embodiment of the present invention.

FIG. 14 is a block diagram illustrating an example of using a multiplexer according to the second preferred embodiment. As illustrated in FIG. 14, a front-end circuit 200 includes multiplexers 210 and 220. The multiplexer 210 and the multiplexer 220 are respectively connected to an antenna 218 and an antenna 228.

The multiplexer 210 includes filters 211, 212, 213, and 214 with pass bands that are different from one another. For example, preferably, the pass bands of the filters 211, 212, 213, and 214 are respectively, in Long Term Evolution (LTE) (registered trademark), an uplink band from about 1920 MHz to about 1980 MHz of a band B1, an uplink band from about 1710 MHz to about 1785 MHz of a band B3, a downlink band from about 2110 MHz to about 2200 MHz of the band B1, and a downlink band from about 1805 MHz to about 1880 MHz of the band B3.

The multiplexer 220 also includes filters 221, 222, 223, and 224 with pass bands that are different from one another. The pass bands of the filters 221, 222, 223, and 224 are preferably, for example, respectively equal or substantially equal to the pass bands of the filters 211, 212, 213, and 214.

The front-end circuit 200 configured in this way adapts to carrier aggregation in which communication is performed by using the band B1 and the band B3 simultaneously. In particular, the front-end circuit 200 adapts to a 2-uplink operation in which a transmission signal in the band B1 and a transmission signal in the band B3 are transmitted simultaneously.

In the 2-uplink operation using the band B1 and the band B3, there is concern that intermodulation distortion between a transmission signal in the band B1 and a transmission signal in the band B3 may occur in a reception band of the band B1. Intermodulation distortion refers to nonlinear distortion that occurs from a first signal of a first frequency $f_1$ and a second signal of a second frequency $f_2$ at a frequency $f_{IMD}$ of $|m \times f_1 \pm n \times f_2|$ (where m and n are natural numbers).

Specifically, a frequency $2f_{B1Tx}$-$f_{B3Tx}$ obtained by subtracting a transmission frequency $f_{B3Tx}$ in the band B3 from a transmission frequency $f_{B1Tx}$ in the band B1 multiplied by two overlaps a reception frequency $f_{B1Rx}$ in the band B1. For this reason, in filters 213 and 223 with the reception band of the band B1 as a pass band, when intermodulation distortion between a transmission signal in the band B1 and a transmission signal in the band B3 occurs, a reception signal in the band B1 is interfered with by the intermodulation distortion having occurred, thus resulting in deterioration in reception sensitivity in the band B1.

Therefore, each of the filters 213 and 223 is defined by with the filter with small nonlinear distortion described in the first preferred embodiment. Consequently, intermodulation distortion between a transmission signal in the band B1 and a transmission signal in the band B3 is reduced, interference with a reception signal in the band B1 is therefore reduced, and reception sensitivity in the band B1 is improved. As each of the filters 213 and 223, for example, the filter 101 may preferably be used. In this case, each of the multiplexers 210 and 220 is the same or substantially the same as the multiplexer 210a in FIG. 13.

The advantageous effects of reducing intermodulation distortion achieved by the multiplexer 210a will be described by contrast with a multiplexer according to a comparative example.

Figure 15:
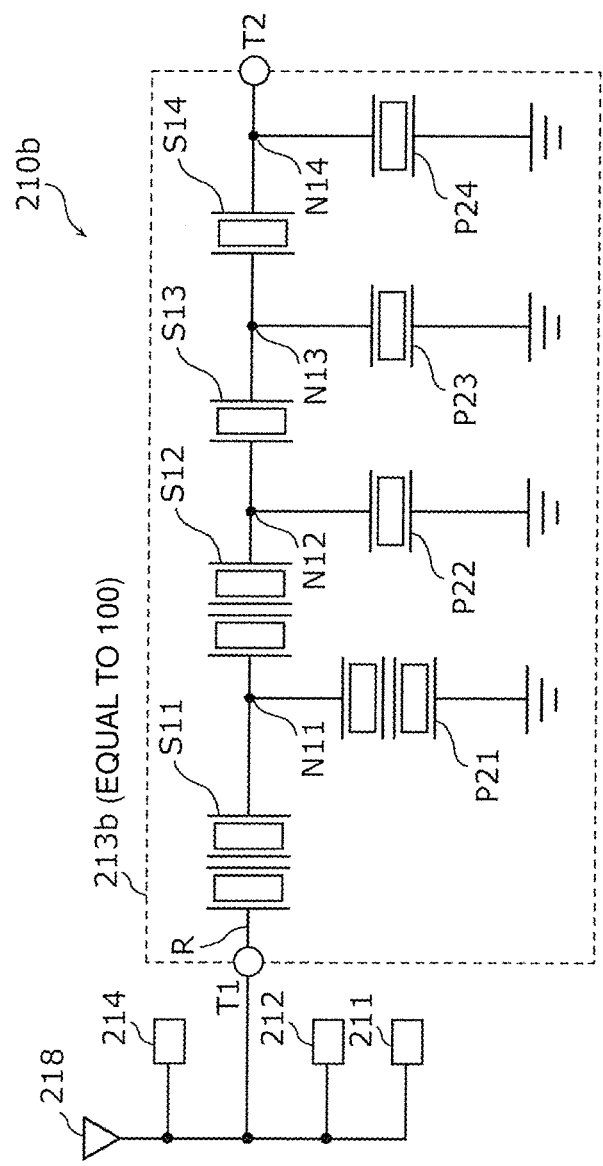
FIG. 15 is a circuit diagram illustrating an example of a configuration of a multiplexer according to a comparative example 1 of the second preferred embodiment of the present invention.

FIG. 15 is a circuit diagram illustrating an example of a configuration of a multiplexer according to a comparative example 1 of the second preferred embodiment. As illustrated in FIG. 15, a multiplexer 210b is configured by replacing the filter 213a of the multiplexer 210a in FIG. 13 with a filter 213b. As the filter 213b, the filter 100 in FIG. 1 is used.

Figure 16:
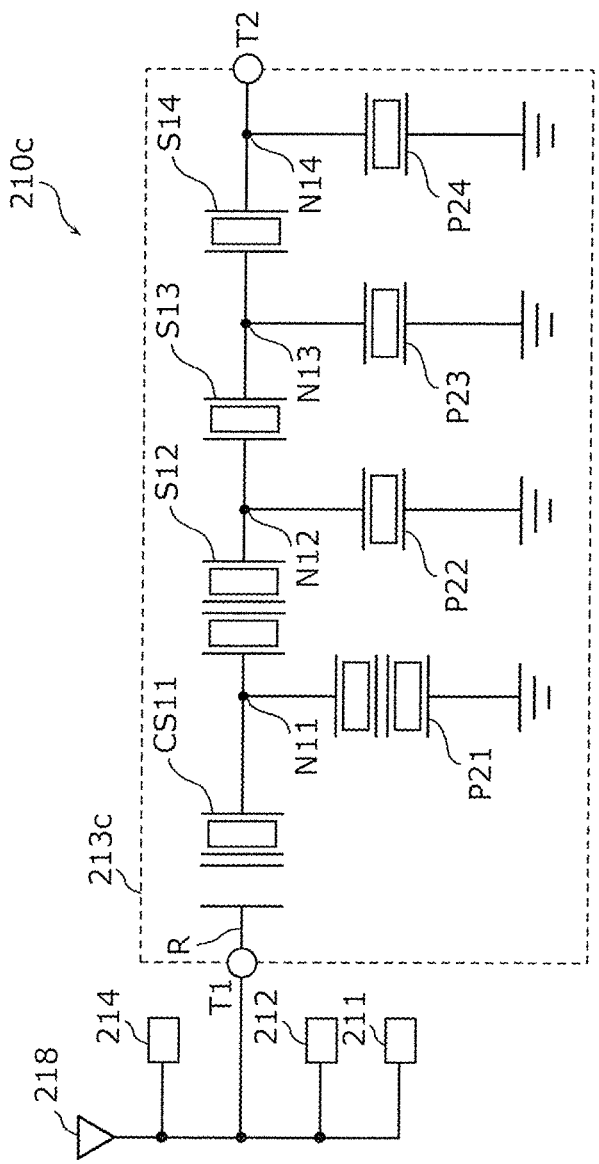
FIG. 16 is a circuit diagram illustrating an example of a configuration of a multiplexer according to a comparative example 2 of the second preferred embodiment of the present invention.

FIG. 16 is a circuit diagram illustrating an example of a configuration of a multiplexer according to a comparative example 2 of the second preferred embodiment. As illustrated in FIG. 16, a multiplexer 210c is configured by replacing the filter 213a of the multiplexer 210a in FIG. 13 with a filter 213c. The filter 213c differs from the filter 213a and the filter 213b in that a series arm circuit CS11 connected to the input terminal is includes a capacitance element and an acoustic wave resonator that are connected in series.

Figure 17:
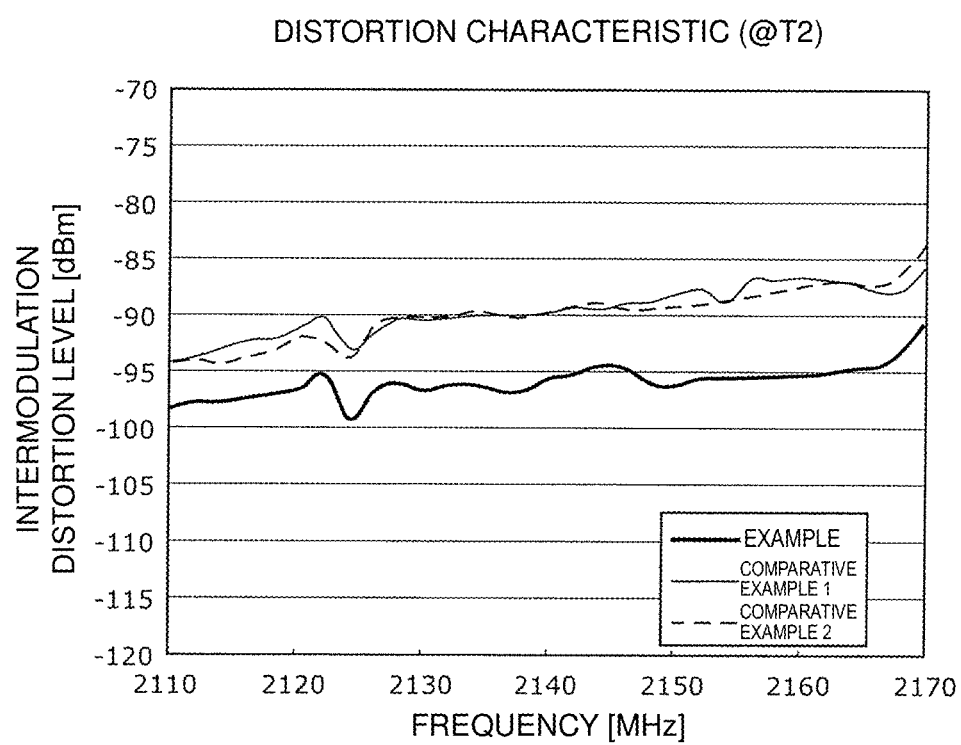
FIG. 17 is a graph illustrating an example of a distortion characteristic of the multiplexer according to the second preferred embodiment of the present invention.

FIG. 17 is a graph illustrating an example of a distortion characteristic of the multiplexer according to the second preferred embodiment.

In FIG. 17, in the case where, as the multiplexer 210 in FIG. 14, the multiplexer 210a (example), the multiplexer 210b (comparative example 1), and the multiplexer 210c (comparative example 2) are used, the levels of intermodulation distortion that occur in the respective filters 213 are indicated for a frequency band from about 2110 MHz to about 2170 MHz.

As illustrated in FIG. 14, a precondition is that a transmission signal in the band B1 is transmitted from the antenna 218 through the multiplexer 210 and that a transmission signal in the band B3 is transmitted from the antenna 228 through the multiplexer 220. Furthermore, it is assumed that there is isolation of about 15 dB between the antennas 218 and 228 and that a level of the transmission signal in the band B1 and a level of the transmission signal in the band B3 that are input to the filter 213 are respectively about 25 dBm and about 10 dBm, for example. Similarly, it is assumed that a level of the transmission signal in the band B1 and a level of the transmission signal in the band B3 that are input to the filter 223 are respectively about 10 dBm and about 25 dBm, for example.

As seen in FIG. 17, in the multiplexer 210b (comparative example 1) and the multiplexer 210c (comparative example 2), almost the same level of intermodulation distortion occurs over the entire frequency band, whereas intermodulation distortion that occurs in the multiplexer 210a (example) is reduced over the entire frequency band. From this result, it was discovered that, when, among a plurality of series arm circuits of a ladder filter, for example, a series arm circuit connected to an input terminal is defined only by a capacitance element, intermodulation distortion is effectively reduced.

A filter according to a preferred embodiment of the present invention includes an input terminal; an output terminal; a signal path connecting the input terminal and the output terminal and being defined by one or more series arm circuits; and one or more parallel arm circuits connected to one or more nodes disposed on the signal path and a ground electrode. The one or more series arm circuits define any of a section between nodes adjacent to each other, a section between a node closest to the input terminal and the input terminal, and a section between a node closest to the output terminal and the output terminal. Among the one or more series arm circuits and the one or more parallel arm circuits, one circuit does not include any acoustic wave resonator, and another circuit includes an acoustic wave resonator.

In this configuration, a configuration in which the one or more series arm circuits and the one or more parallel arm circuits include an acoustic wave resonator is the same or substantially the same as a basic configuration of a ladder acoustic wave filter. On the other hand, in the above-described configuration, one series arm circuit or one parallel arm circuit does not include any acoustic wave resonator, and thus, the filter is obtained in which nonlinear distortion caused by an acoustic wave resonator is reduced in comparison with a basic ladder acoustic wave filter.

Furthermore, the one circuit may preferably be defined by a capacitance element, for example.

In this configuration, the one circuit is defined by the capacitance element with smaller nonlinearity than an acoustic wave resonator, and thus, the filter is obtained that has small nonlinear distortion while having characteristics close to characteristics of the basic ladder acoustic wave filter.

Furthermore, the acoustic wave resonator may preferably include a substrate having piezoelectricity and an interdigital transducer (IDT) electrode provided on the substrate, and the capacitance element may be defined by an IDT electrode provided on the substrate or by a surface mount device mounted on the substrate.

In this configuration, the capacitance element is able to be mounted on the same substrate on which the acoustic wave resonator is mounted, and thus, the filter is obtained that is excellent in downsizing.

Furthermore, the one circuit may define, of the signal path, the section between the node closest to the input terminal and the input terminal.

This configuration is able to effectively reduce intermodulation distortion, which is an example of nonlinear distortion.

Furthermore, the one circuit may define, of the signal path, the section between the node closest to the output terminal and the output terminal.

This configuration is able to effectively reduce harmonic distortion, which is an example of nonlinear distortion.

Furthermore, one series arm circuit of the one or more series arm circuits may include, as the acoustic wave resonator, a longitudinally coupled resonator.

In this configuration, the filter with small nonlinear distortion is obtained.

A multiplexer according to a preferred embodiment of the present invention includes a plurality of filters each including one end connected to one another, and at least one filter of the plurality of filters is a filter according to a preferred embodiment of the present invention.

In this configuration, the multiplexer includes the filter with small nonlinear distortion, and thus, the multiplexer is obtained that has little deterioration in characteristics caused by nonlinear distortion in the filter.

Furthermore, the plurality of filters may include a first filter, a second filter, and a third filter. When a frequency in a pass band of the first filter is denoted by $f_1$ and a frequency in a pass band of the second filter is denoted by $f_2$, at least one frequency of a plurality of frequencies $f_{IMD}$ represented by $|m \times f_1 \pm n \times f_2|$, where m and n are natural numbers, may be in a pass band of the third filter. The third filter may preferably be a filter according to a preferred embodiment of the present invention.

In this configuration, under circumstances where intermodulation distortion between a signal in the pass band of the first filter and a signal in the pass band of the second filter occurs in the pass band of the third filter, when the filter with small nonlinear distortion is used as the third filter, intermodulation distortion is reduced. As a result, the multiplexer is obtained that has little deterioration in characteristics caused by intermodulation distortion, such as deterioration in reception sensitivity that occurs, for example, when the third filter is a reception filter.

Furthermore, the first filter may preferably have, for example, a pass band from about 1920 MHz to about 1980 MHz inclusive, the second filter may have a pass band from about 1710 MHz to about 1785 MHz inclusive, and the third filter may have a pass band from about 2110 MHz to about 2200 MHz inclusive.

In this configuration, the pass bands of the first filter, the second filter, and the third filter are, specifically, a transmission band of the band B1, a transmission band of the band B3, and a reception band of the band B1 in the LTE (registered trademark). That is, the first filter, the second filter, and the third filter are used as a transmission filter of the band B1, a transmission filter of the band B3, and a reception filter of the band B1 in the LTE (registered trademark).

Here, when the 2-uplink operation is performed in which a transmission signal in the band B1 and a transmission signal in the band B3 are transmitted simultaneously, intermodulation distortion at a frequency obtained by subtracting a frequency of the transmission signal in the band B3 from a frequency of the transmission signal in the band B1 multiplied by two occurs in the reception band of the band B1. Thus, when the filter with small nonlinear distortion is used as the third filter to reduce intermodulation distortion, deterioration in reception sensitivity in the band B1 is able to be reduced.

Although the filters and the multiplexer according to the preferred embodiments of the present invention have been described above, the present invention is not limited to these preferred embodiments. Preferred embodiments obtained by making various modifications conceived by a person skilled in the art to the present preferred embodiments, or preferred embodiments provided by combining components in different preferred embodiments may also be included in the scope of one or a plurality of aspects of the present invention as long as they do not depart from the gist of the present invention.

Preferred embodiments of the present invention may be widely used as a filter with small nonlinear distortion and a multiplexer in communication equipment, such as mobile phones, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter comprising:
an input terminal;
an output terminal;
a signal path connecting the input terminal and the output terminal and including two or more series arm circuits; and
two or more parallel arm circuits connected to two or more nodes disposed on the signal path and a ground electrode; wherein
the two or more series arm circuits define any of a section between nodes adjacent to each other, a section between a node closest to the input terminal and the input terminal, and
a section between a node closest to the output terminal and the output terminal;
among the two or more series arm circuits and the two or more parallel arm circuits, one circuit does not include any acoustic wave resonator, and another circuit includes an acoustic wave resonator;
the one circuit that does not include any acoustic wave resonator is included among the two or more series arm circuits;
the one circuit defines the section between the node closest to the input terminal and the input terminal; and
an inductance element is not connected between the one circuit and the node closest to the input terminal.

2. The filter according to claim 1, wherein the one circuit is defined by a capacitance element.

3. The filter according to claim 2, wherein
the acoustic wave resonator includes a substrate having piezoelectricity and an interdigital transducer (IDT) electrode provided on the substrate; and
the capacitance element is defined by an IDT electrode provided on the substrate.

4. The filter according to claim 2, wherein
the acoustic wave resonator includes a substrate having piezoelectricity and an interdigital transducer (IDT) electrode provided on the substrate; and
the capacitance element is defined by a surface mount device mounted on the substrate.

5. A filter comprising:
an input terminal;
an output terminal;
a signal path connecting the input terminal and the output terminal and including one or more series arm circuits; and
one or more parallel arm circuits connected to one or more nodes disposed on the signal path and a ground electrode; wherein
the one or more series arm circuits define any of a section between nodes adjacent to each other, a section between a node closest to the input terminal and the input terminal, and a section between a node closest to the output terminal and the output terminal;
among the one or more series arm circuits and the one or more parallel arm circuits, one circuit does not include any acoustic wave resonator, and another circuit includes an acoustic wave resonator;
the one circuit that does not include any acoustic wave resonator is included among the one or more series arm circuits;
the one circuit defines the section between the node closest to the input terminal and the input terminal, or the one circuit defines the section between the node closest to the output terminal and the output terminal;
an inductance element is not connected between the one circuit and the node closest to the input terminal or between the one circuit and the node closest to the output terminal; and
one series arm circuit of the one or more series arm circuits includes, as the acoustic wave resonator, a longitudinally coupled resonator.

6. A multiplexer comprising:
a plurality of filters each including one end connected to one another; wherein
the plurality of filters include a first filter, a second filter, and a third filter;
when a frequency in a pass band of the first filter is denoted by $f_1$ and a frequency in a pass band of the second filter is denoted by $f_2$, at least one frequency of a plurality of frequencies $f_{IMD}$ represented by $|m \times f_1 \pm n \times f_2|$, where m and n are natural numbers, is in a pass band of the third filter; and
the third filter includes:
an input terminal;
an output terminal;
a signal path connecting the input terminal and the output terminal and including one or more series arm circuits; and
one or more parallel arm circuits connected to one or more nodes disposed on the signal path and a ground electrode;
the one or more series arm circuits define any of a section between nodes adjacent to each other, a section between a node closest to the input terminal and the input terminal, and a section between a node closest to the output terminal and the output terminal;
among the one or more series arm circuits and the one or more parallel arm circuits, one circuit does not include any acoustic wave resonator, and another circuit includes an acoustic wave resonator;
the one circuit that does not include any acoustic wave resonator is included among the one or more series arm circuits;

the one circuit defines the section between the node closest to the input terminal and the input terminal, or the one circuit defines the section between the node closest to the output terminal and the output terminal; and an inductance element is not connected between the one circuit and the node closest to the input terminal or between the one circuit and the node closest to the output terminal.

7. The multiplexer according to claim 6, wherein
the first filter has a pass band from about 1920 MHz to about 1980 MHz inclusive;
the second filter has a pass band from about 1710 MHz to about 1785 MHz inclusive; and
the third filter has a pass band from about 2110 MHz to about 2200 MHz inclusive.

8. The multiplexer according to claim 6, wherein the one circuit defines the section between the node closest to the input terminal and the input terminal.

9. The multiplexer according to Claim 6, wherein the one circuit defines the section between the node closest to the output terminal and the output terminal.

10. A multiplexer comprising:
a plurality of filters each including one end connected to one another; wherein
at least one filter of the plurality of filters includes:
    an input terminal;
    an output terminal;
    a signal path connecting the input terminal and the output terminal and including one or more series arm circuits; and
    one or more parallel arm circuits connected to one or more nodes disposed on
the signal path and a ground electrode;
the one or more series arm circuits define any of a section between nodes adjacent to each other, a section between a node closest to the input terminal and the input terminal, and a section between a node closest to the output terminal and the output terminal;
among the one or more series arm circuits and the one or more parallel arm circuits, one circuit does not include any acoustic wave resonator, and another circuit includes an acoustic wave resonator;
the one circuit that does not include any acoustic wave resonator is included among the one or more series arm circuits;
the one circuit defines the section between the node closest to the input terminal and the input terminal, or the one circuit defines the section between the node closest to the output terminal and the output terminal;

an inductance element is not connected between the one circuit and the node closest to the input terminal or between the one circuit and the node closest to the output terminal; and
one series arm circuit of the one or more series arm circuits includes, as the acoustic wave resonator, a longitudinally coupled resonator.

11. The multiplexer according to claim 6, wherein the one circuit includes a capacitance element.

12. The multiplexer according to claim 11, wherein
the acoustic wave resonator includes a substrate having piezoelectricity and an interdigital transducer (IDT) electrode provided on the substrate; and
the capacitance element is defined by an IDT electrode provided on the substrate.

13. The multiplexer according to claim 11, wherein
the acoustic wave resonator includes a substrate having piezoelectricity and an interdigital transducer (IDT) electrode provided on the substrate; and
the capacitance element is defined by a surface mount device mounted on the substrate.

14. A multiplexer comprising:
a plurality of filters each including one end connected to one another; wherein
at least one filter of the plurality of filters includes:
    an input terminal;
    an output terminal;
    a signal path connecting the input terminal and the output terminal and including one or more series arm circuits; and
    one or more parallel arm circuits connected to one or more nodes disposed on
the signal path and a ground electrode;
the one or more series arm circuits define any of a section between nodes adjacent to each other, a section between a node closest to the input terminal and the input terminal, and a section between a node closest to the output terminal and the output terminal;
among the one or more series arm circuits and the one or more parallel arm circuits, one circuit does not include any acoustic wave resonator, and another circuit includes an acoustic wave resonator;
the one circuit that does not include any acoustic wave resonator is included among the one or more series arm circuits;
the one circuit defines the section between the node closest to the input terminal and the input terminal; and
an inductance element is not connected between the one circuit and the node closest to the input terminal.

* * * * *